(12) United States Patent
Carroll

(10) Patent No.: US 10,784,924 B2
(45) Date of Patent: Sep. 22, 2020

(54) PASSIVE SIGNAL PROPAGATION DELAY CALCULATIONS

(71) Applicant: Schweitzer Engineering Laboratories, Inc., Pullman, WA (US)

(72) Inventor: Russell C. Carroll, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 787 days.

(21) Appl. No.: 15/494,287

(22) Filed: Apr. 21, 2017

(65) Prior Publication Data

US 2018/0306849 A1    Oct. 25, 2018

(51) Int. Cl.
| G01R 27/28 | (2006.01) |
| H04B 3/46 | (2015.01) |
| G01R 27/32 | (2006.01) |
| G01R 31/11 | (2006.01) |

(52) U.S. Cl.
CPC .............. *H04B 3/46* (2013.01); *G01R 27/32* (2013.01); *G01R 31/11* (2013.01)

(58) Field of Classification Search
CPC ... H04B 3/00; H04B 3/02; H04B 3/46; H04B 5/0037; H04B 5/0043; H04B 17/0085; H04B 17/21; H04B 17/26; H04B 17/364; G01R 27/28; G01R 27/32; G01R 31/08; G01R 31/11; G01R 31/50; G01R 31/58; H02J 50/12; H02J 50/40; H02J 50/80; H02J 7/025; G01D 5/2006; G01V 3/10; G01V 3/30; G01V 3/12; H01F 38/14; G01S 13/0209; G01S 13/878; G01S 13/885; G01S 15/08; G01S 15/42; G01S 17/08; G01S 2013/468

See application file for complete search history.

(56) References Cited

U.S. PATENT DOCUMENTS

| 4,908,576 | A | * | 3/1990 | Jackson | ............. | G01R 31/2806 |
| | | | | | | 324/73.1 |
| 5,633,709 | A | * | 5/1997 | Ohtaki | ............... | G01M 11/3145 |
| | | | | | | 356/73.1 |
| 6,133,725 | A | * | 10/2000 | Bowhers | ............ | G01R 31/3191 |
| | | | | | | 324/750.01 |
| 6,484,299 | B1 | * | 11/2002 | Larsen | ..................... | G11C 5/04 |
| | | | | | | 327/277 |
| 6,597,165 | B2 | * | 7/2003 | Lambert | .............. | G01R 31/319 |
| | | | | | | 324/73.1 |

(Continued)

*Primary Examiner* — Vinh P Nguyen
(74) *Attorney, Agent, or Firm* — Justin K. Flanagan

(57) ABSTRACT

Systems and methods are described for calculating a propagation delay of a transmission line. A transmitter may transmit a signal from a first end of a transmission line to a second end of the transmission line at a first time, $t_1$. A signal reflection device (e.g., a passive resonator) connected to the second end of the transmission line may generate a reflection at a second time, $t_2$. A reflection detector (e.g., a matched, passive resonator) at the first end of the transmission line may receive the reflection from the signal reflection device, at a third time, $t_3$. A propagation delay calculator may calculate the propagation delay of the transmission line as corresponding to one-half of a difference between the first time, $t_1$, and the third time, $t_3$.

11 Claims, 6 Drawing Sheets

(56) References Cited

U.S. PATENT DOCUMENTS

| | | | | |
|---|---|---|---|---|
| 7,135,871 | B1* | 11/2006 | Pelletier | G01N 22/04 324/640 |
| 2002/0089335 | A1* | 7/2002 | Williams | G01R 31/11 324/533 |
| 2003/0218463 | A1* | 11/2003 | Stierman | G01R 31/11 324/534 |
| 2006/0087323 | A1* | 4/2006 | Furse | H04W 24/00 324/519 |
| 2010/0304701 | A1* | 12/2010 | Jung | H04B 1/525 455/280 |
| 2015/0207491 | A1* | 7/2015 | Bao | H03H 7/32 333/118 |
| 2018/0122666 | A1* | 5/2018 | Kim | G01R 1/067 |

* cited by examiner

PASSIVE SIGNAL PROPAGATION DELAY CALCULATIONS

TECHNICAL FIELD

The present disclosure pertains to systems and methods for calculating a signal propagation delay on a transmission line. Many embodiments describe the use of passive resonant reflections for detecting signal propagation delay.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

DETAILED DESCRIPTION

Figure 1:
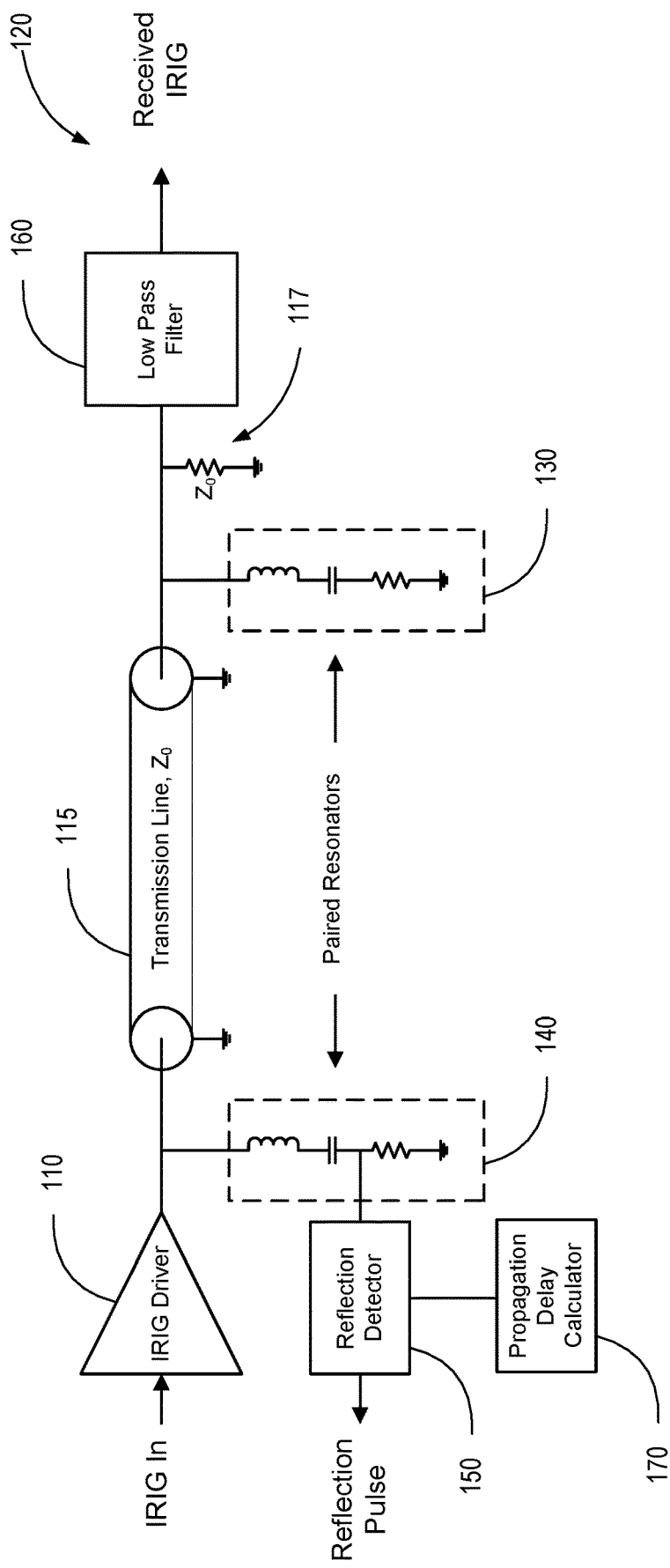
FIG. 1 illustrates an example block diagram of an IRIG system with paired resonators, according to one embodiment.

Electrical power generation and delivery systems are designed to generate, transmit, and distribute electrical energy to loads. Electrical power generation and delivery systems include a variety of equipment, such as electrical generators, electrical motors, power transformers, conductive cables for electrical distribution and/or communication (referred to herein generally as "transmission lines"), circuit breakers, switches, buses, transmission and/or feeder lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, SVC controllers, OLTC controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together. The systems and method described herein may be incorporated within, implemented by, or embodied as an IED.

Various actions performed by IEDs included in an electric power generation and delivery system may be coordinated using time-coordinated instructions and/or other time-coordinated information exchanged therebetween. For example, one or more IEDs may be configured to detect and protect electrical power system equipment from abnormal conditions, such as fault events, by issuing one or more time-coordinated control instructions to associated electrical power system equipment configured to mitigate damage caused by the abnormal conditions. One or more IEDs may further be configured to generate, distribute, and/or receive monitored system data in the form of time-synchronized measurement data relating to monitored currents and/or voltages (e.g., represented as time-synchronized phasors, synchrophasors, or the like) for use in connection with associated monitoring, control, automation, and/or protection activities.

In various embodiments, common time signals may be utilized for synchronizing various data exchanged between IEDs and/or associated electrical power system equipment (e.g., by applying time stamps or the like). Common time signals may provide an indication of an accurate and/or standardized time such as, for example, coordinated universal time (UTC) or Greenwich Mean Time (GMT), although other time standards may also be utilized in connection with the disclosed systems and methods. A centralized accurate time source may provide common time signals to various IEDs by such as, for example, an atomic clock and/or the like. In some embodiments, one or more synchronized distributed accurate time sources may provide common time signals to various IEDs by.

Common time signals may be distributed to various IEDs in a variety of ways, including via wired and/or wireless communication channels. For example, an IRIG signal may be used to distribute common time signals to various IEDs. Similarly, a Global Navigation Satellite System (GNSS) communication signal, a common radio signal such as WWV or WWVB, a network time signal such as IEEE 1588, or the like, may be used to distribute a common time signal to one or more IEDs for control, monitoring, or protection activities.

Common time signals transmitted over long distances, such as via a transmission line, may experience a propagation delay. For example, propagation delay may occur during transmission of a common time signal from a centralized accurate time source to a remotely-located IED receiving the common time signal for use in connection with time-synchronized communications and/or activities. Propagation delay may be related to a variety of transmission parameters including, for example, transmission cable length, transmission cable type, ambient temperature, and/or the like.

Propagation delays, if unknown, may detrimentally affect the accuracy of the common time signal for use as a reference. If, however, the propagation delay is known then the sending device and/or the receiving device may account for the known propagation delay to increase the accuracy of the common time signal used as the reference. For instance, to compensate for propagation delay, time information included in the common time signal may be advanced by the amount of the propagation delay. Alternatively, a propagation delay correcting device may receive a common time signal and adjust the time accordingly.

In some embodiments, a period of time associated with propagation delay between an accurate time source and a receiving IED may be estimated based on a material and/or length of a transmission line and any intervening components (e.g., a number of minutes and/or seconds of an associated propagation delay period). In various embodiments, encoded time information included in the common time signal may be decoded and modified to advance the corresponding time information by the estimated propagation delay period by modifying the encoded time information. A corrected time signal may be generated that includes the modified encoded time information and be transmitted to an associated receiving IED. The receiving IED may receive the corrected time signal, and may utilize the modified encoded time information included in the corrected time signal in connection with coordinating various time-synchronized communications and/or activities.

It may be difficult to accurately estimate a propagation delay of a transmission line if the exact distance is not known, if intervening components or connections are present, and/or if cable degradation has impacted performance. The present disclosure provides a variety of methods and systems, many of which can be used in combination, to calculate (e.g., identify, measure, process, detect, determine, etc.) a propagation delay of a transmission line. In various embodiments, a passive reflector may be used. For example, in one embodiment a first passive resonator is used to reflect a signal on a receiving end of a transmission line back to a second passive resonator on a transmitting end of the transmission line.

In various embodiments, any of a wide variety of signal reflection devices may be positioned proximate a first end of a transmission line. In various embodiments, the signal reflection device may actively generate a return signal or "reflection" in response to receiving a transmitted signal from the second (transmitting) end of the transmission line. A reflection detector on the second end of the transmission line may compare the time that that the transmitted signal was sent and the time the return signal or reflection was received. The difference between the timing of the transmitted signal was sent and the timing that the return signal was received will be approximately equal to double the propagation delay of the transmission line. Active signal generators and receivers may be costly, introduce additional delays, and/or interfere with normal operation and transmissions on the transmission line.

Various embodiments of the systems and methods described herein may benefit from the use of passive signal reflection devices and/or reflection detectors. In one embodiment, a passive signal reflection device may comprise a passive impedance element with a resistance less than that of the transmission line. By connecting the relatively low impedance element to the transmission line, an impedance mismatch is created which will cause reflections of received signal back to the transmitting end of the transmission line.

In another embodiment, a passive signal reflection device may be a resonator circuit, such as an LC circuit (inductor-capacitor circuit) or LRC circuit (inductor-resistor-capacitor circuit). An LC or LRC circuit may be tuned to generate a reflection that is outside of the frequency range typically used on the transmission line for other communications. For example, the LC or LRC circuit may generate a high frequency reflection that can be detected by the reflection detector. A filter may be used to filter out the high frequency reflection from communication or timing devices connected to the transmission line.

Thus, in at least one specific embodiment, a first resonator functioning as at least a part of a signal reflection device, is connected proximate a receiving end of a transmission line in parallel with, for example, an IRIG receiver of an IED. An IRIG driver transmits a timing signal from a second end (transmitting end) of the transmission line to the IRIG receiver at a first time, $t_1$. A second resonator connected proximate the second, transmitting end of the transmission line may operate as at least a part of a reflection detector to receive the timing signal at the first time, $t_1$.

After a propagation delay, $d_1$, the first resonator generates a high frequency reflection in response to the received timing signal at a second time, $t_2$, that is equal to the first time plus the propagation delay, $t_1+d_1$. In some embodiments, a low pass filter may filter that high frequency reflection and prevent it from being received by the IRIG receiver. At a third time, $t_3$, the second resonator receives the high frequency reflection. A calculator, associated with or integrated as part of the reflection detector, calculates the propagation delay, $d_1$, by dividing the difference between the first time, $t_1$, and the third time, $t_3$, in half.

The passively calculated propagation delay may be used to adjust the IRIG timing signal or may be transmitted with the IRIG timing signal for the IRIG receiver to utilize. In various embodiments, the system described above may be employed as a continually available passive measurement system to continually update the IRIG timing signal. Because the system is passive and the reflection can be filtered before being received by the IRIG receiver, non-invasive measurements can be performed without disrupting operation of the electrical system, continually, or periodically. In some embodiments, a monitor may compare differences in the measured propagation delay over time and provide an error alert or actuate a protection mechanism if the difference between two measured propagation delays over a period of time exceeds a threshold value.

Thus, in at least one embodiment, passive, paired resonators are added to IRIG output and input circuits. The resonator at the receiver creates an impedance mismatch at high frequencies and causes reflections back to the transmitter. The transmitter has a matched resonator to detect the reflected pulse from the IRIG receiver. The transmission delay can be calculated at the driver as half the time it takes to see the first reflection of a transmitted signal.

In various embodiments, the signal reflection device and the reflection detector have matched LC or LRC tuned circuits. In some embodiments, passive LC or LRC tuned circuits may be tuned before being connected to a transmission line and in other embodiments one or more of a capacitance, resistance, and inductance may be varied after connected to a transmission line for matching (or mismatching) impedance values of one or more of the transmitter, transmission line(s), and receiver. The LC or LRC circuits may also be tuned to produce and receive specific reflection frequencies and/or to match one another without specific regard to the exact reflection frequency.

In some embodiments, a non-resonant load can be used to generate reflections. The systems and methods described herein may utilize square wave signals, such as pulse per second (PPS) and/or thousand pulse per second (KPPS) signals. Furthermore, the presently described signal reflection devices and reflection detectors may be integrated into IRIG drivers and receivers and/or into transmission line terminals.

For example, in a system with a transmission line with an impedance of 50 Ohms, a resistor with less than 50 Ohms may be used to terminate the transmission line to produce reflections that can be detected as described above. In some embodiments, a parasitic capacitance associated with a receiver on the transmission line may be utilized to generate a high frequency reflection that can be detected by the reflection detector. The high frequency reflection caused by parasitic capacitance of the receiver, such as an IRIG receiver, may be frequency-adjusted (i.e., tuned to a specific frequency) by adding one or more resisters, capacitors, and/or inductors to the receiving end of the transmission line and/or to the IRIG receiver.

In one specific embodiment, a transmission line with an impedance of, for example, 50 ohms, is connected to an IRIG receiver. Reflections caused by the parasitic capacitance of the IRIG receiver are detected by the reflection detector. In such an embodiment, the signal reflection device may be embodied as the parasitic capacitance of the IRIG receiver. In another embodiment, an impedance element (e.g., a resister) is added to the end of the transmission line proximate the IRIG receiver and a reflection generated by the combination of the parasitic capacitance the impedance element is detected by the reflection detector.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc. that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

Some of the embodiments of the disclosure can be understood by reference to the drawings, wherein like parts are generally designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. Well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 illustrates an example of a block diagram of an IRIG system with paired resonators 130 and 140, according to one embodiment. As illustrated, a transmission line 115 may be used to connect an IRIG driver 110 to a device to receive the IRIG signal, at 120. The transmission line may have an impedance value shown as resistor $Z_O$ 117. in various embodiments, the IRIG driver 110 transmits a timing signal to the receiving device 120, via the transmission line 115. A first resonator 130 is connected to the transmission line 115 in parallel with the receiving device 120. The first resonator 130 generates a reflection that returns through the transmission line 115.

In some embodiments, a low pass filter 160 may filter the reflection to prevent it from being received the receiving device 120. However, at the transmitting end of the transmission line 115, a second resonator 140 may receive the reflection and detect it via reflection detector 150. By comparing the time that the timing signal was sent and the timing that the reflection is received, the propagation delay calculator 170 connected to the reflection detector 150 may calculate the propagation delay of the transmission line and any intervening components or connections that add delay. For example, if the transmission line comprises multiple cables connected through one or more connection devices, the calculated propagation delay would relate to the entire system.

Figure 2:
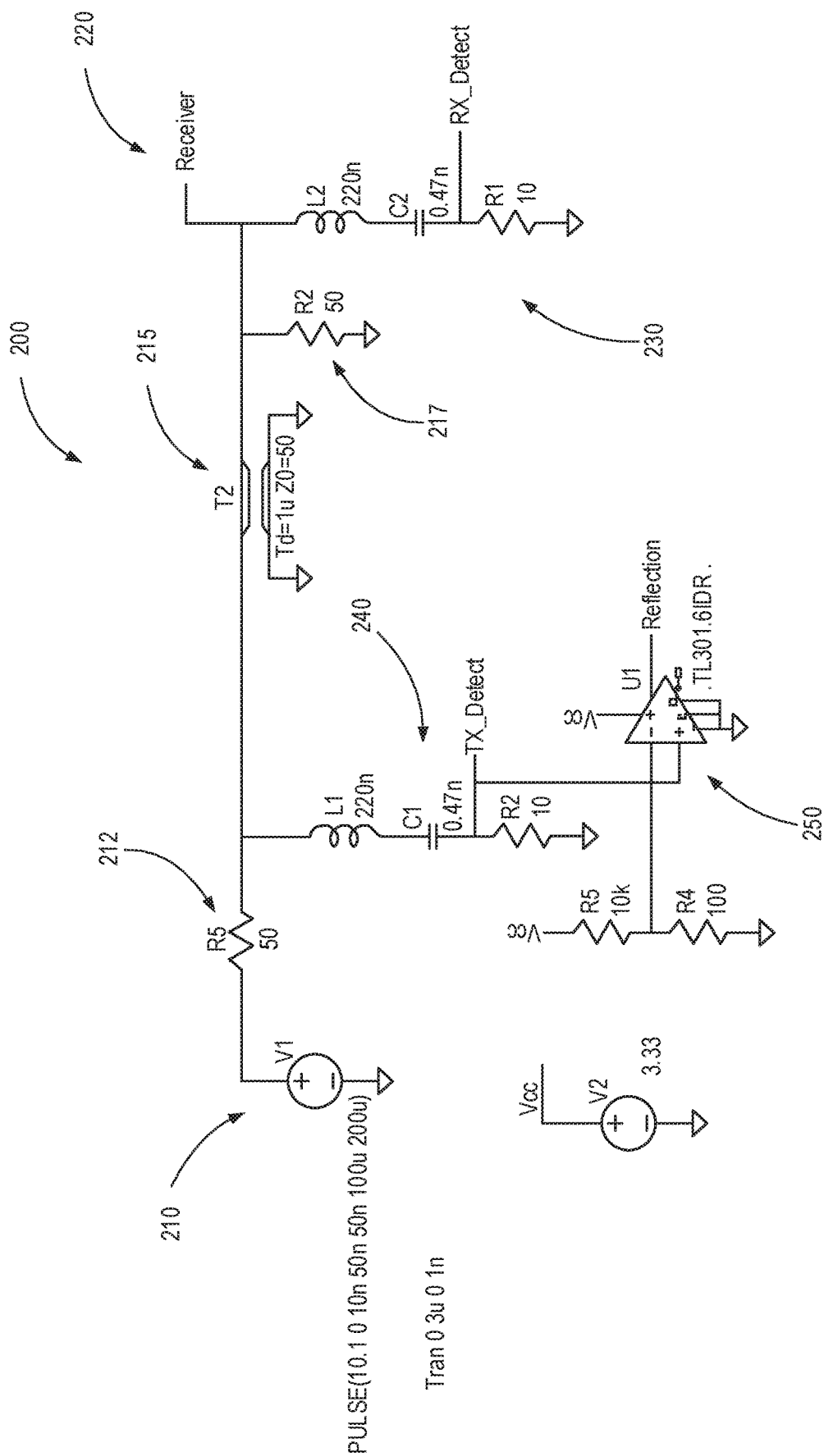
FIG. 2 illustrates an example schematic diagram for simulating the functionality of paired resonators connected to the ends of a transmission line, according to one embodiment.

FIG. 2 illustrates an example of a schematic diagram 200 for simulating the functionality of paired resonators 230 and 240 on a transmission line 215, according to one embodiment. As illustrated, a pulsed voltage source 210 is used to represent a transmitter on one end of the transmission line 215. The impedance R5 212 of the connected voltage source 210 corresponds to (e.g., is matched with) that of the transmission line 215. A receiver 220 is likewise matched as shown with resistor R2 217. A first resonator 230 is shown with an inductor, capacitor, and resistor. The first resonator 230 generates a reflection in response to receiving a pulse from voltage source 210.

The second resonator 240 includes an inductor, capacitor, and a resistor as well and is configured to receive the reflection from the first resonator 230 after a propagation delay over the transmission line 215. A reflection detector may further include a comparator circuit 250 to identify the reflection. A calculation device may determine the time that a signal is transmitted by voltage source 210 and determine the time that a reflection is received and detected by the second resonator 240 and comparator circuit 250 at a second time. The calculation device may calculate the propagation delay as being equal to approximately one half of the difference between the first time and the second time.

In some embodiments, one or both resonators may be tuned to produce and/or receive reflections with a specific frequency. For example, a frequency may be used that is outside of a bandwidth typically used by the transmitter 210 and/or receiver 220. In other embodiments, one or both resonators may be dynamically tuned to produce and receive reflections at various frequencies to determine an average propagation delay for various frequencies and/or propagation delays for each of a plurality of frequencies or frequency bandwidths. For example, a potentiometer may be adjusted to adjust a resistance, an inductive value may be changed, and/or a capacitive value may be changed to vary the frequency of the reflection produced and/or received by the resonators.

Figure 3:
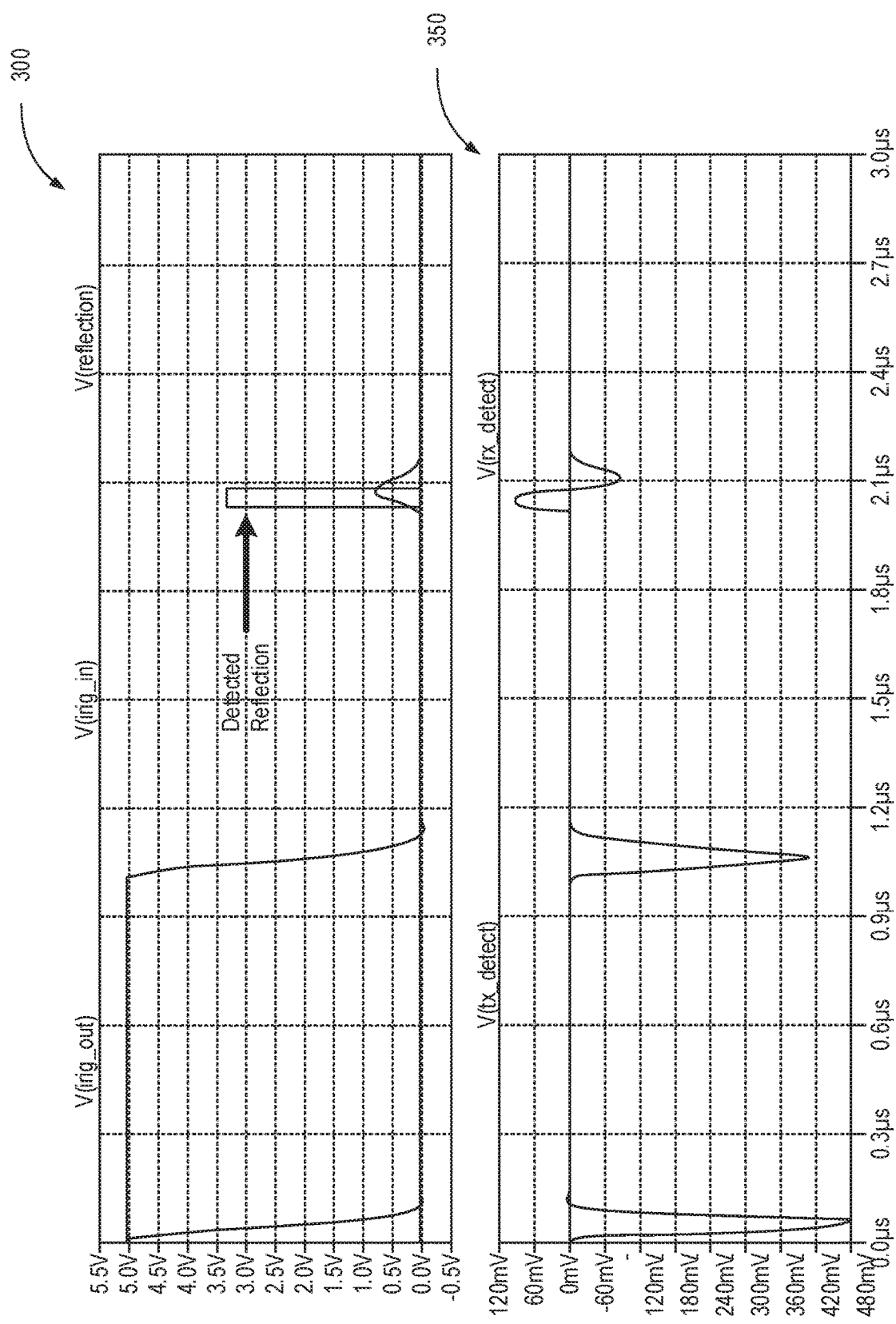
FIG. 3 illustrates waveforms generated using the schematic diagram of FIG. 2 to show the functionality of paired resonators for calculating a propagation delay associated with the transmission line, according to one embodiment.

FIG. 3 illustrates waveforms 300 and 350 generated using the schematic diagram of FIG. 2 to show the functionality of paired resonators for calculating a propagation delay over the transmission line, according to one embodiment. As illustrated, a falling edge of a transmission signal begins dropping at time 0.0 μs. The falling edge is received by the resonator at time 1.0 μs and a reflection is received and detected at approximately time 2.0 μs.

Figure 4:
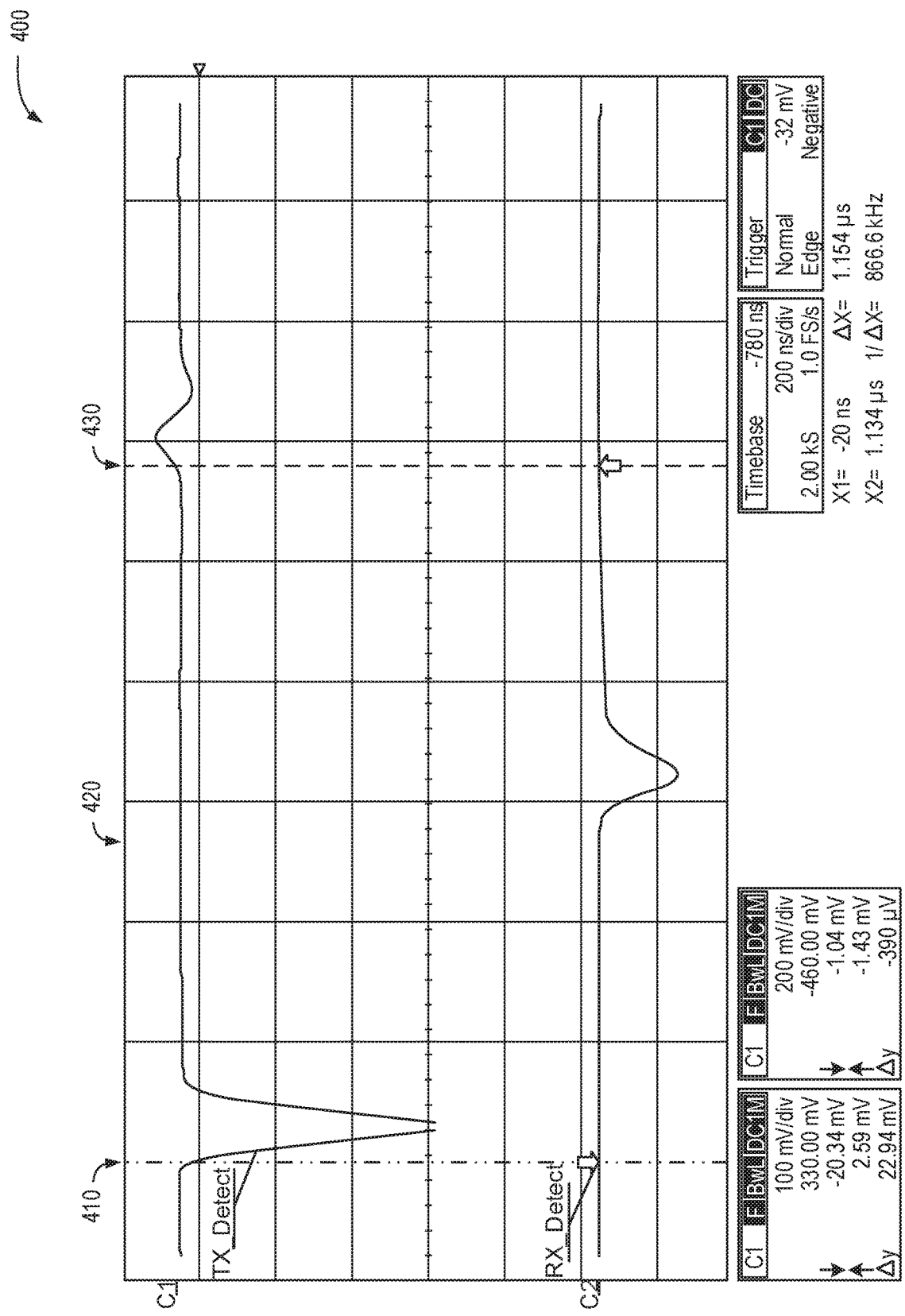
FIG. 4 illustrates measurements of the waveforms in FIG. 3 used to calculate a propagation delay over the transmission line, according to one embodiment.

FIG. 4 illustrates measurements of the waveforms in FIG. 3 used to calculate a propagation delay over the transmission line, according to one embodiment. As illustrated, a falling edge is detected, at 410 at a first time by a circuit on the transmitting end of the transmission line. At 420, the falling edge is received at the receiving end of the transmission line, potentially unbeknownst to the logic on the transmitting side of the transmission line. At 430, the circuit on the transmitting end of the transmission line receives the reflection from the resonator connected at the receiving end of the transmission line. By calculating one-half of the difference in time between the detected transmission 410 and received reflection 430, a propagation delay of the transmission line can be detected.

Figure 5:
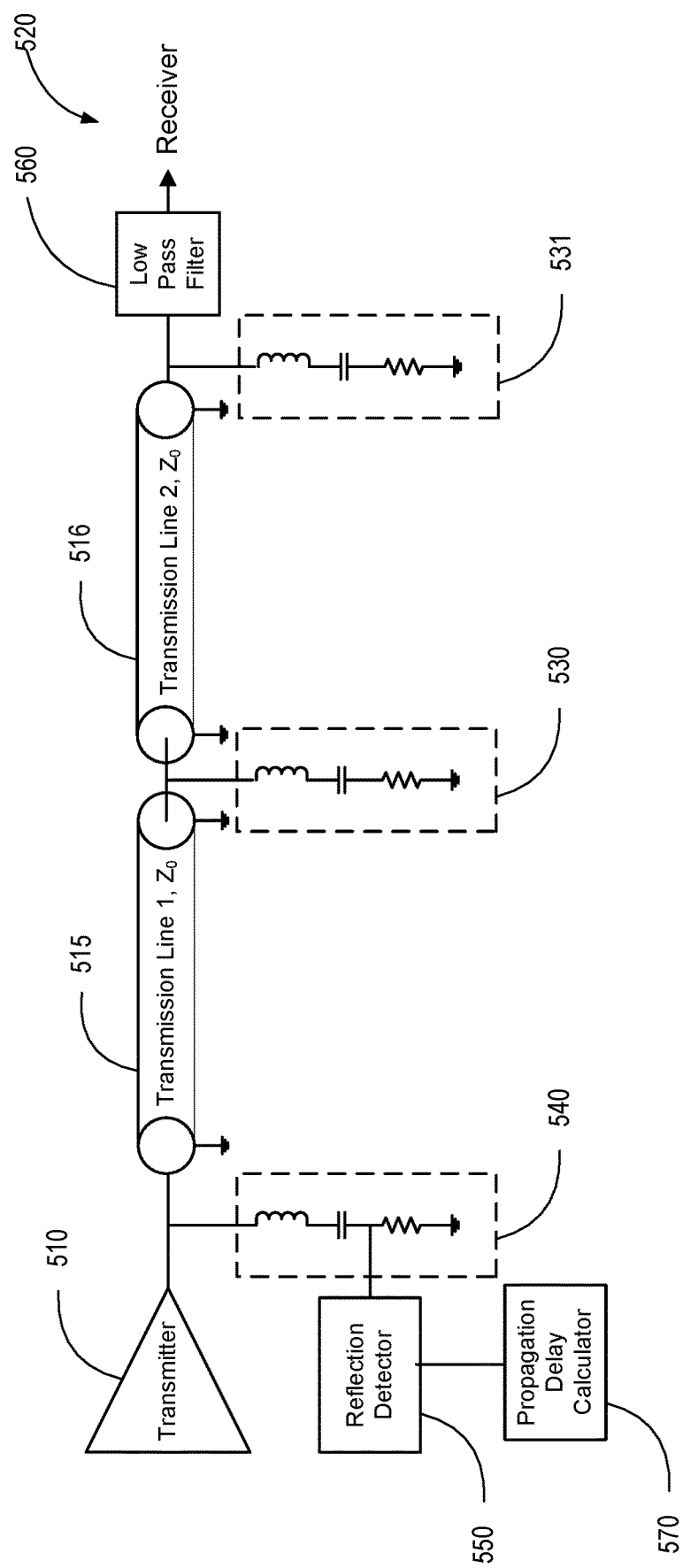
FIG. 5 illustrates another example block diagram of a system with two transmission lines and two reflection generating resonators, according to one embodiment.

FIG. 5 illustrates a transmitter 510 connected to a receiver 520 via a first transmission line 515 and a second transmission line 516. A low pass filter 560 may limit high frequency reflections from signal reflection device 530 and signal reflection device 531 from being received by receiver 520. In various embodiments, when transmitter 510 send a signal via transmission lines 515 and 516, the first signal reflection device (shown as an LRC resonator) may generate a reflection at a first frequency, $f_1$, and the second signal reflection device (also shown as an LRC resonator) may generate a reflection at a second frequency, $f_2$.

Reflection detector 550 may mark or record the timing that transmitter 510 sent a signal. Reflection detector resonating circuit 540 may have a bandwidth sufficiently wide to receive reflections from the first and second signal reflection devices 530 and 531 at the first and second frequencies $f_1$ and $f_2$. The reflection detector 550 may mark or record the timing that a reflection is received at the first frequency, $f_1$, from the first signal reflection device 530 and then mark or record the timing that a second reflection is received at the second frequency, $f_2$.

The propagation delay calculator 570 may calculate a propagation delay for the first transmission line 515 based on one half of the difference in timing from when the transmitter 510 transmitted a signal and when the first reflection is received. A total propagation delay for the combination of the first and second transmission lines 515 and 516 (and any intervening or connecting components) may be calculated based on one half of the difference in timing from when the transmitter 510 transmitted the signal and when the second reflection is received. Finally, a propagation delay for the second transmission line (and any intervening components) may be calculated by subtracting the total propagation delay from the propagation delay of the first transmission line.

Figure 6:
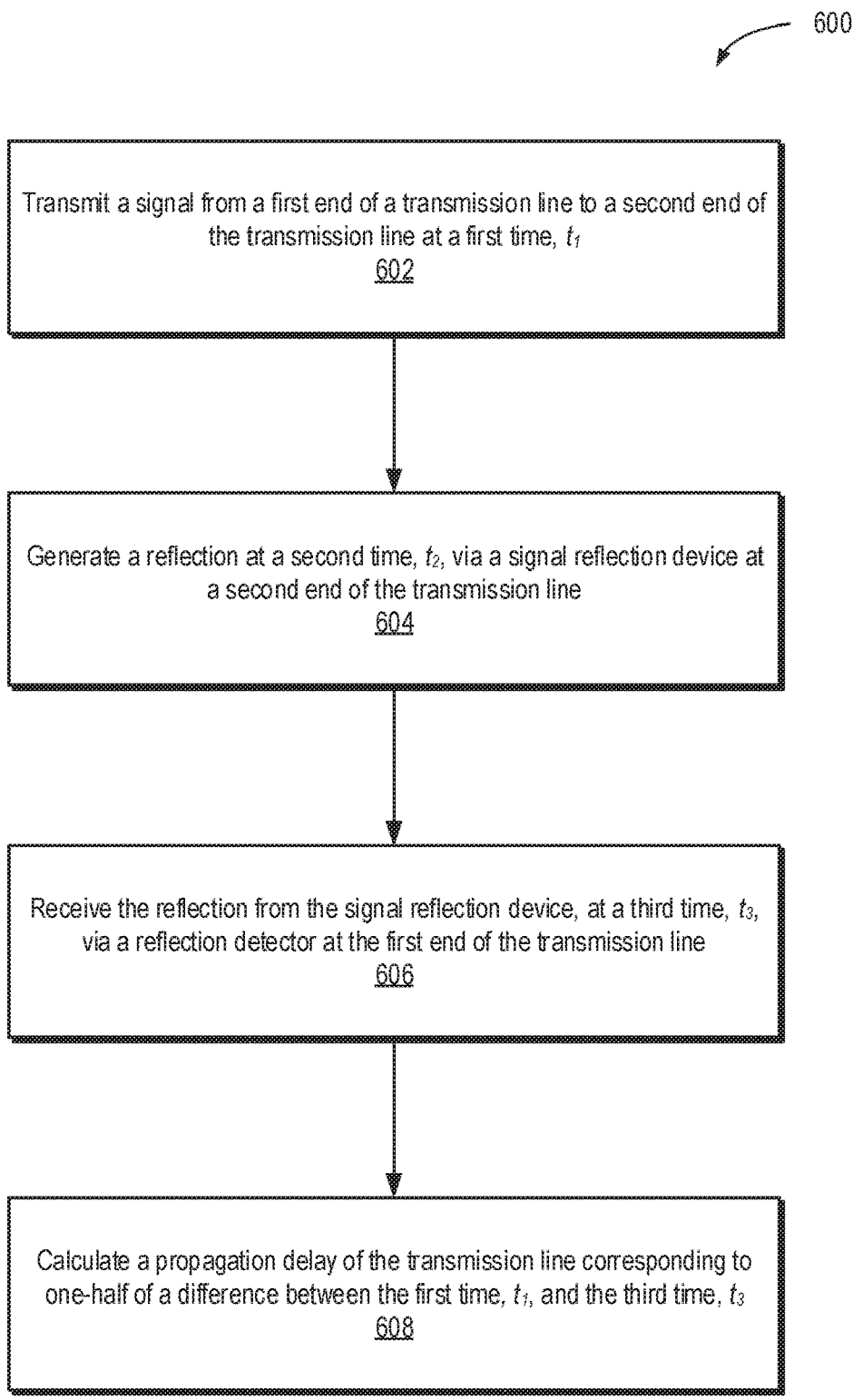
FIG. 6 illustrates a flow chart of a method for calculating a propagation delay over a transmission line, according to one embodiment.

FIG. 6 illustrates a flow chart of a method 600 for calculating a propagation delay over a transmission line, according to one embodiment. Utilizing any of the various embodiments or combination of embodiments described herein, a transmitter may transmit a signal from a first end of a transmission line to a second end of the transmission line at a first time, $t_1$, at 602. A signal reflection device connected to the second end of the transmission line may generate a reflection at a second time, $t_2$, at 604

A reflection detector at the first end of the transmission line may receive the reflection from the signal reflection device, at a third time, $t_3$, at 606. A propagation delay calculator may calculate the propagation delay of the transmission line as corresponding to one-half of a difference between the first time, $t_1$, and the third time, $t_3$, at 608.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined in the context of the following claims.

What is claimed is:

1. A system for signal propagation delay calculations on a transmission line, comprising:
   a signal reflection device with a first impedance value for electrical connection proximate a first end of a transmission line with a second impedance value, wherein the first impedance value of the signal reflection device is mismatched with respect to the second impedance value of the transmission line, wherein the signal reflection device comprises a passive resonator to cause a high frequency reflection on the transmission line;
   a low pass filter positioned between the passive resonator of the first reflection device and a signal receiver connected to the first end of the transmission line to filter out the high frequency reflection;
   a reflection detector with a third impedance value for electrical connection proximate a second end of the transmission line with the second impedance value, wherein the reflection detector is configured to:
      receive a signal transmitted from the second end of the transmission line to the first end of the transmission line at a first time;
      receive, at a second time, a signal reflection from the signal reflection device caused by the mismatched first and second impedance values;
   a propagation delay calculator associated with the reflection detector to determine a signal propagation delay of the transmission line corresponding to one-half of a difference between the first time and the second time.

2. The system of claim 1, wherein the passive resonator comprises an inductor, a capacitor, and a resistor.

3. The system of claim 1, wherein the reflection detector is a resonator comprising an inductor, a capacitor, and a resistor to receive the high frequency reflection generated by the signal reflection device.

4. The system of claim 1, wherein the third impedance value of the signal detector is matched with the first impedance value of the signal reflection device.

5. A method for calculating a signal propagation delay of a transmission line, comprising:
   transmitting a signal from a first end of a transmission line to a second end of the transmission line at a first time, t1;
   generating a reflection in response to the transmitted signal, at a second time, t2, via a signal reflection device electrically connected to the transmission line proximate the second end of the transmission line, wherein the signal reflection device comprises a resonator to generate a high frequency reflection on the transmission line;
   filtering the high frequency reflection out of a signal to be received by a signal receiver connected to the second end of the transmission line;
   receiving the high frequency reflection from the signal reflection device, at a third time, t3, via a reflection detector electrically connected to the transmission line proximate the first end of the transmission line; and
   calculating a propagation delay associated with the transmission line corresponding to one-half of a difference between the first time, t1, and the third time, t3.

6. The method of claim 5, wherein the signal reflection device comprises a resistor with an impedance less than an impedance of the transmission line.

7. The method of claim 5, wherein the resonator is a passive resonator comprising an inductor, a capacitor, and a resistor.

8. The method of claim 5, wherein receiving the reflection from the signal reflection device comprises receiving the high frequency reflection via a resonator comprising an inductor, a capacitor, and a resistor.

9. A system for passive measurement of signal propagation delay on a transmission line, comprising:
   a first passive resonator for electrical connection proximate a first end of a transmission line,
      wherein the first passive resonator is configured to generate a high frequency reflection to a second end of the transmission line in response to received signals on the transmission line;
   a low pass filter positioned between the first passive resonator and a signal receiver connected to the first end of the transmission line to filter out the high frequency reflection;
   a second passive resonator for electrical connection proximate the second end of the transmission line;
   a reflection detector electrically connected to said second passive resonator;
      wherein the second passive resonator is configured to:
         receive a data signal transmitted from the second end of the transmission line to a first end of the transmission line at a first time, and
         receive a reflection of the data signal from the first passive resonator at a second time; and
   a calculator associated with said reflection detector to determine a signal propagation delay of the transmission line corresponding to one-half of a difference between the first time and the second time.

10. The system of claim 9, wherein each of the first passive resonator and the second passive resonator comprises an inductor and a capacitor.

11. The system of claim 9, wherein the reflection generated by the first passive resonator in response to received signals on the transmission line is a high frequency reflection that does not overlap with the frequencies of the received signals.

* * * * *